United States Patent
Park et al.

(10) Patent No.: US 12,557,538 B2
(45) Date of Patent: Feb. 17, 2026

(54) DISPLAY APPARATUS COMPRISING DISPLAY PANEL AND HEAT-DISSIPATING STRUCTURE

(71) Applicant: LG DISPLAY CO., LTD., Seoul (KR)

(72) Inventors: Chanhyeok Park, Paju-si (KR); Chikyung Sung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 581 days.

(21) Appl. No.: 17/966,141

(22) Filed: Oct. 14, 2022

(65) Prior Publication Data

US 2023/0209889 A1 Jun. 29, 2023

(30) Foreign Application Priority Data

Dec. 27, 2021 (KR) .................. 10-2021-0188393

(51) Int. Cl.
  *H10K 59/80* (2023.01)
(52) U.S. Cl.
  CPC .............................. *H10K 59/8794* (2023.02)
(58) Field of Classification Search
  None
  See application file for complete search history.

(56) References Cited

U.S. PATENT DOCUMENTS

| 10,190,211 | B2 | 1/2019 | Farquhar et al. |
| 10,241,549 | B2 | 3/2019 | Uto et al. |
| 10,865,474 | B2 | 12/2020 | Farquhar et al. |
| 2016/0334843 | A1* | 11/2016 | Uto ...................... G06F 3/0443 |
| 2018/0162098 | A1* | 6/2018 | Joo ........................ B32B 9/007 |
| 2021/0175462 | A1* | 6/2021 | Shin ..................... G06F 1/1601 |
| 2022/0020956 | A1 | 1/2022 | Kim |

FOREIGN PATENT DOCUMENTS

| JP | 6337012 B2 | 6/2018 |
| KR | 20170029376 A | 3/2017 |
| KR | 10-2018-0102550 A | 9/2018 |
| KR | 10-2020-0083775 A | 7/2020 |

OTHER PUBLICATIONS

Office Action in Korean Appln. No. 20210188393, mailed on Dec. 8, 2024, 9 pages (with English translation).

* cited by examiner

*Primary Examiner* — Daniel Whalen
(74) *Attorney, Agent, or Firm* — Fish & Richardson P.C.

(57) ABSTRACT

A display apparatus includes a display panel configured to display an image from one surface of the display panel; a first rigid member disposed at another surface of the display panel; a first adhesive layer disposed at an upper portion of the first rigid member; and a first heat-dissipation layer disposed at an upper portion of the first adhesive layer, wherein the first heat dissipation layer has a first recess or a second recess having a step formed inwardly in one side or another side.

10 Claims, 5 Drawing Sheets

DISPLAY APPARATUS COMPRISING DISPLAY PANEL AND HEAT-DISSIPATING STRUCTURE

CROSS-REFERENCE TO RELATED APPLICATION

This application claims the priority of Korean Patent Application No. 10-2021-0188393 filed on Dec. 27, 2021, which is hereby incorporated by reference in its entirety.

BACKGROUND

Field of the Disclosure

The present disclosure relates to a display apparatus, and more particularly, to a display apparatus capable of improving a heat-dissipation function and reducing a thickness.

Description of the Background

A display apparatus is used in a variety of forms and manners in televisions, monitors, smart phones, tablet PCs, notebooks, wearable apparatuses, and the like. Among the display apparatuses used in the various forms and manners, an organic light-emitting display apparatus (OLED) is developed.

The organic light-emitting display apparatus has a self-emissive element in which the element itself generates light, and thus a separate light source is not required, thereby implementing a display apparatus which is bendable or has various designs. Further, the organic light-emitting display apparatus may be thinner than a liquid crystal display apparatus (LCD) and has advantages of excellent color rendering, a large viewing angle, a high contrast ratio, and a fast response speed, thereby realizing high-definition video. Thus, an application range thereof is gradually increasing.

The organic light-emitting display apparatus includes a display area configured to display an image and a non-display area formed along an outer edge of the display area. Additional components may be disposed in the non-display area, or various connecting components such as a flexible circuit board for connecting the additional components to each other may be disposed in the non-display area. The non-display may be referred to as a bezel area.

A thickness and a width of the display apparatus may increase as the apparatus includes a plurality of additional parts. As the thickness and the width of the display apparatus increase, a design and a portability of the apparatus may be poor. Thus, research on schemes to reduce the thickness and the width of the display apparatus is in progress.

Further, when the display apparatus operates, heat may be generated in a driver integrated circuit, etc. Accordingly, a heat-dissipation layer may be disposed on a rear surface of a display panel to emit or dissipate the heat from the driver integrated circuit, etc. Research is being conducted on a scheme to increase efficiency of the heat-dissipation.

A thickness of the heat-dissipation layer may be increased to effectively dissipate the heat of the driver integrated circuit. However, an overall thickness of the display apparatus increases as much as the thickness of the added heat-dissipation layer, thereby increasing a bezel area.

Further, after a manufacturing or bending process of the display panel is performed, it is difficult to additionally attach the heat-dissipation layer thereto due to a nature of a process. Thus, it may be difficult to effectively dissipate the heat from the driver integrated circuit.

SUMMARY

Accordingly, the present disclosure is to provide a display apparatus with improved heat-dissipation performance without increasing the thickness of the display apparatus.

More specifically, the present disclosure is to provide a display apparatus capable of improving heat-dissipation performance without increasing an overall thickness of a display apparatus.

The present disclosure is not limited to the above-mentioned features. Other advantages of the present disclosure that are not mentioned may be understood based on following descriptions, and may be more clearly understood based on aspects of the present disclosure. Further, it will be easily understood that advantages of the present disclosure may be realized using means shown in the claims and combinations thereof.

In an aspect of the present disclosure, a display apparatus includes a display panel configured to display an image from one surface of the display panel; a first rigid member disposed at another surface of the display panel; a first adhesive layer disposed at an upper portion of the first rigid member; and a first heat-dissipation layer disposed at an upper portion of the first adhesive layer, wherein the first heat-dissipation layer has a first recess or a second recess having a step formed inwardly in one side or another side.

In another aspect of the present disclosure, a display apparatus includes a display panel configured to display an image from one surface of the display panel; a first member disposed at another side of the display panel; a first adhesive layer disposed at an upper portion of the first member; a first heat-dissipation layer disposed at an upper portion of the first adhesive layer and formed of a metal having pores; and a third heat-dissipation layer disposed at an upper portion of the first heat-dissipation layer and including an ink material, wherein the first heat-dissipation layer has a recess having a step formed inwardly in a lower surface of the first heat-dissipation layer.

According to the present disclosure, the metal layer having multiple pores acts as the heat-dissipation layer, and the recess is formed in the heat-dissipation layer such that an additional heat-dissipation layer is received in the recess. Thus, the heat-dissipation performance may be improved without increasing the overall thickness of the display apparatus. This may not increase the bezel area of the display apparatus.

Effects of the present disclosure are not limited to the above-mentioned effects, and other effects as not mentioned will be clearly understood by those skilled in the art from following descriptions.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain principles of the disclosure.

Figure 1:
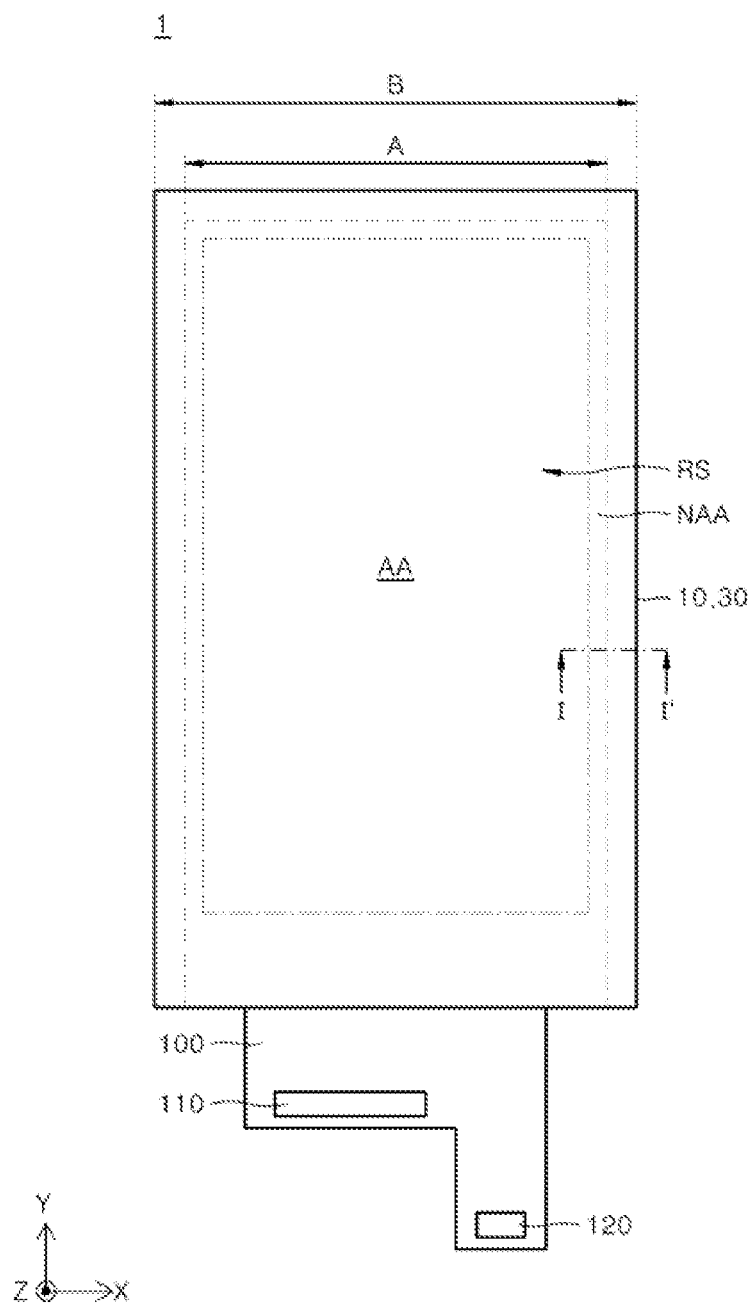
FIG. 1 is a plan view of a display apparatus according to an aspect of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Advantages and features of the present disclosure, and a method of achieving the advantages and features will become apparent with reference to aspects described later in detail together with the accompanying drawings. However, the present disclosure is not limited to the aspects as disclosed below, but may be implemented in various different forms. Thus, these aspects are set forth only to make the present disclosure complete, and to completely inform the scope of the present disclosure to those of ordinary skill in the technical field to which the present disclosure belongs, and the present disclosure is only defined by the scope of the claims.

A shape, a size, a ratio, an angle, a number, etc. disclosed in the drawings for describing the aspects of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to describing particular aspects only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various aspects of the present disclosure may be partially or entirely combined with each other, and may be technically associated with each other or operate with each other. The aspects may be implemented independently of each other and may be implemented together in an association relationship.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various aspects of the present disclosure may be partially or entirely combined with each other, and may be technically associated with each other or operate with each other. The aspects may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "display apparatus" may include, in a narrow sense, a display apparatus including a liquid crystal module (LCM), an organic light-emitting diode (OLED) module, or a quantum dot (QD) module including a display panel and a driver for driving the display panel. Moreover, the display apparatus may include, in a broad sense, a laptop computer, a television, a computer monitor, an automotive apparatus or an equipment display for a vehicle, a set electronic apparatus, a set apparatus or a set apparatus including a complete product or a final product including the LCM, the OLED module, or the QD module.

Therefore, the display apparatus in accordance with the present disclosure may include, in the narrow sense, a display apparatus itself including, for example, the LCM, the OLED module, QD module, etc., and may include, in a broad sense, the set apparatus as an application product or an end-user apparatus including a complete product or a final product including the LCM, the OLED module, or the QD module.

Moreover, in some cases, the LCM, OLED module, or QD module composed of the display panel and the driver may be expressed as "display apparatus" in a narrow sense. The electronic apparatus as a complete product including the LCM, OLED module or QD module may be expressed as "set apparatus" in a broad sense. For example, the display apparatus in the narrow sense may include a display panel such as a liquid crystal panel, an organic light-emitting display panel, or a quantum dot display panel, and a source PCB as a controller for driving the display panel. The set apparatus in the broad sense may include a display panel such as a liquid crystal panel, an organic light-emitting display panel, or a quantum dot display panel, a source PCB as a controller for driving the display panel, and a set PCB as a set controller that is electrically connected to the source PCB and controls the set apparatus.

As used herein, the display panel may be of any type of the display panels such as a liquid crystal display panel, an organic light emitting diode (OLED) display panel, a quantum dot (QD) display panel, and an electroluminescent display panel, etc. The display panel used in the present disclosure may be not limited to a specific display panel including a flexible substrate for the OLED display panel and an underlying back plate support structure and having a bendable bezel. Moreover, the display panel used in the display apparatus according to an aspect of the present disclosure is not limited to a shape or a size of the display panel.

More specifically, when the display panel is embodied as the organic light emitting diode (OLED) display panel, the display panel may include a plurality of gate lines and data lines, and pixels respectively formed in areas where the gate lines and the data lines intersect with each other. Moreover, the display panel may be configured to include an array including a thin-film transistor as an element for selectively applying a voltage to each pixel, an organic light-emitting element layer on the array, and an encapsulation substrate or an encapsulation layer disposed on the array to cover the organic light-emitting element layer. The encapsulation layer protects the thin-film transistor and the organic light-emitting element layer from external impact, and may prevent moisture or oxygen from penetrating into the organic light-emitting element layer. Moreover, the light emitting layer formed on the array may include an inorganic light emitting layer, for example, a nano-sized material layer, or a quantum dot.

Hereinafter, various configurations of a display apparatus capable of improving a heat-dissipation effect without increasing an overall thickness of the apparatus will be described in detail.

Figure 2:
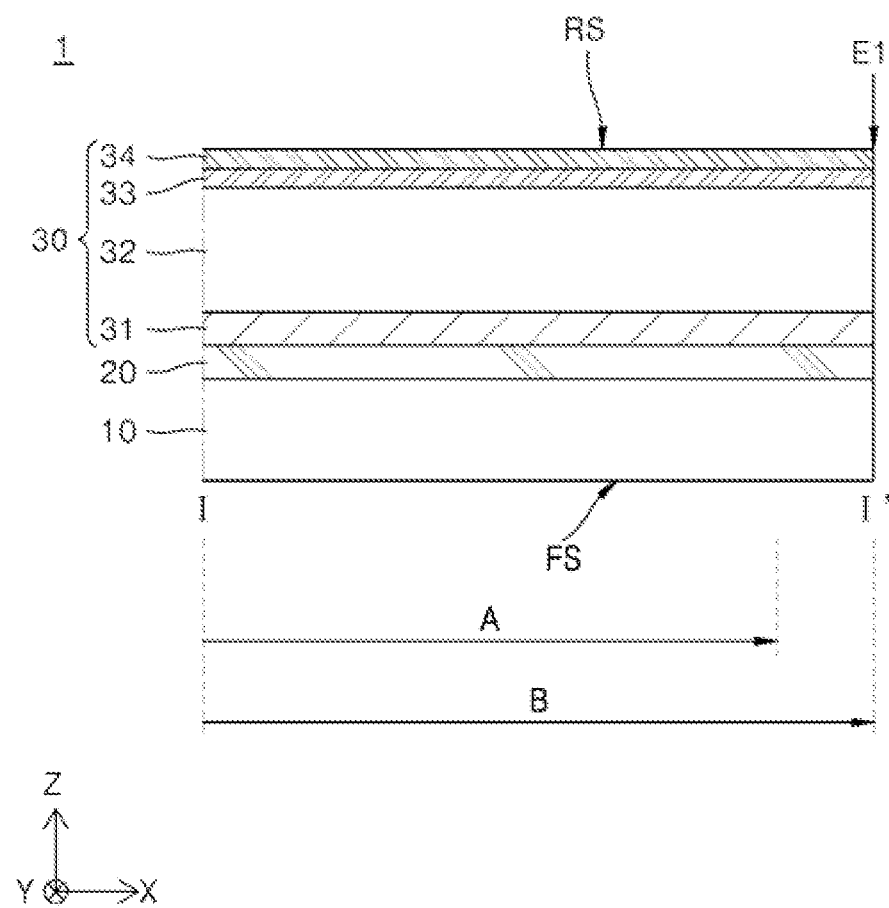
FIG. 2 is a cross-sectional view taken along cutting line I-I' in FIG. 1.

FIG. 1 is a plan view of a display apparatus according to an aspect of the present disclosure. FIG. 2 is a cross-sectional view taken along a cutting line I-I' of FIG. 1.

As used herein, and as shown in FIGS. 1 and 2, a direction toward a rear surface RS and a top face refers to a Z-axis direction, and a direction toward a front surface FS and a bottom face refers to a −Z-axis direction. In one example, FIG. 1 shows a rear surface RS of the display apparatus.

With reference to FIGS. 1 and 2, a display apparatus 1 may be configured to include a display panel 10, a rigid member 20, and a heat-dissipating structure 30. Although not shown in the drawing, a cover member may be attached to the display apparatus 1 via a fixing member.

The display panel 10 may include a display substrate formed of polymer or plastic such as polyimide (PI), or glass. The display panel 10 may include a display area AA configured to display an image and a non-display area NAA. A plurality of sub-pixels configured to display an image and a driving circuit for driving the plurality of sub-pixels may be disposed in the display area AA. A pixel array may include the plurality of sub-pixels and the driving circuit. The non-display area NAA may be formed to surround the display area AA and may be an area where no image is displayed.

A bezel may refer to the non-display area NAA surrounding the display area AA in the display apparatus 1. The non-display area NAA and the bezel of the display apparatus 1 may be the same area. A circuit board 100, a driver integrated circuit 110, and a connector 120 connected to an external apparatus may be disposed in the non-display area NAA. The connector 120 may be a current connector. However, the present disclosure is not limited to the terminology.

In one aspect of the present disclosure, a chip-on film (COF) in which the driver integrated circuit 110 is directly mounted on the display panel 10 may be employed. However, aspects of the present disclosure are not limited thereto. The circuit board 100 may be embodied as a flexible printed circuit board (FPCB). The circuit board 100 may be directly mounted or attached to the display panel 10.

One side (or one end) of the circuit board 100 may be attached to the non-display area NAA of the display panel 10, and the other side (or the other end) may be then bent to be disposed on a rear surface RS of the display panel 10 such that a size of the non-display area NAA visible in a front-ward direction may be reduced. Further, after a one end of the display panel 10 on which the circuit board 100 is mounted together with the circuit board 100 is bent to a certain amount, thereby further reducing a size of the non-display area NAA of the display panel 10 visible in the frontward direction.

In another aspect of the present disclosure, in order to reduce a size of the non-display area NAA of the display panel 10 visible in the frontward direction as much as possible, one side (or one end) of the display panel 10 may be bent so as to be disposed on the rear surface RS of the display panel 10. In the bent state of the circuit board 100, the driver integrated circuit 110 may be disposed on a rear surface RS of the display substrate.

As a radius of curvature at which the display panel 10 or the circuit board 100 is bent increases, a size of the non-display area of the display panel 10 visible in the frontward direction increases, and an overall thickness of the display apparatus 1 is reduced, thereby reducing a radius of curvature of the circuit board 100.

Although not shown, the pixel array including a thin-film transistor layer and a light-emitting element may constitute an upper portion of the display panel 10. The pixel array includes the plurality of sub-pixels. Each of the plurality of sub-pixels may be an individual unit emitting light. The light-emitting element may be disposed in each of the plurality of sub-pixels.

The driver integrated circuit 110 generates a data signal and a gate control signal based on image data and a timing synchronization signal supplied from an external host driving system. Moreover, the driver integrated circuit 110 may supply the data signal to a data line of each sub-pixel via a display pad, and may supply the gate control signal to a gate driving circuit via the display pad.

Since the driver integrated circuit 110 generates a larger amount of heat, it may be necessary to effectively impart a heat-dissipation effect to the driver integrated circuit 110. For example, the heat from the driver integrated circuit 110 may be effectively dissipated via the heat-dissipating structure 30.

The heat-dissipating structure 30 may be positioned between the display panel 10 and the driver integrated circuit 110 to effectively dissipate the heat generated from the display panel 10 as well as the driver integrated circuit 110. The heat-dissipating structure 30 may be referred to as a cushion plate or a heat-dissipation layer. The present disclosure is not limited to the terminology.

The rigid member (or first rigid member) 20 may be disposed at an upper side (or an upper portion) of the display panel 10. The rigid member 20 may be disposed on a bottom surface (or a lower surface) of the display substrate constituting the display panel 10 and may supplement rigidity of the display substrate. The rigid member 20 may be formed to have a certain strength and a certain thickness to supplement the rigidity of the display substrate. The rigid member 20 may be referred to as a back plate, a support layer, or a first rigid member, etc. The present disclosure is not limited to the terminology.

The heat-dissipating structure 30 may be disposed at an upper side (or an upper portion) of the rigid member 20. The heat-dissipating structure 30 may have a heat-dissipation function and an impact absorption function, and may be configured to include an adhesive member (or first adhesive layer) 31, a conductive structure 32, a functional layer 33 and a metal layer 34. For example, the adhesive member 31, the conductive structure 32 and the functional layer 33 and the metal layer 34 may be sequentially stacked in a direction toward a rear surface RS of the display apparatus 1.

The adhesive member 31 constitutes the heat-dissipating structure 30, and may adhere the rigid member 20 and the conductive structure 32 to each other. The adhesive member 31 may be referred to as an adhesive layer, or a first adhesive layer, etc. The present disclosure is not limited to the terminology.

The conductive structure 32 is composed of a single structure embodied as a porous substrate rather than a stack structure of a heat-dissipation layer and a cushion layer, so that interlayer separation does not occur therein, and the conductive structure 32 may have a heat-dissipation function and an impact absorption function.

The functional layer 33 may be disposed on a bottom surface of the display substrate constituting the display panel 10, for example, on an upper side (or an upper portion) of the conductive structure 32, and may provide an adhesion force while supplementing the rigidity of the display substrate. The functional layer 33 may be formed to have a certain strength and a certain thickness to supplement the rigidity of the display substrate. The functional layer 33 may be referred to as a second adhesive member, a support layer, or a PI (polyimide layer), etc. The present disclosure is not limited to the terminology.

The metal layer 34 may be disposed on an upper side (or an upper portion) of the functional layer 33, and may transfer heat received via the conductive structure 32. The metal layer 34 may be formed of a metal material having high thermal conductivity and have a certain thickness in order to increase heat transfer efficiency. For example, the metal layer 34 may be formed of copper (Cu), silver (Ag), or aluminum (Al). However, aspects of the present disclosure are not limited thereto.

In one aspect of the present disclosure, the heat-dissipating structure 30 may be formed to have a size smaller than a size of each of the display panel 10 and the rigid member 20. When the heat-dissipating structure 30 is formed to be larger than the display panel 10, the non-display area NAA may be increased. Accordingly, the heat-dissipating structure 30 may be formed to have the size smaller than the size of the rigid member 20 so as not to increase the non-display area NAA. In one example, when the heat-dissipating structure 30 is smaller than the rigid member 20, a weight of the display apparatus 1 may be reduced and a manufacturing cost thereof may be reduced, but the heat-dissipation ability and impact absorption ability may be lowered.

Further, when the heat-dissipating structure 30 is smaller than the rigid member 20, a step occurs between the heat-dissipating structure 30 and the rigid member 20. Thus, in a one end area of the display panel 10 where the step is formed, the display panel 10 protrudes while the heat-dissipating structure 30 is not supported. Thus, a portion of the display panel 10 in the one end area may be easily damaged when an external impact is applied thereto.

Accordingly, the display apparatus 1 according to one aspect of the present disclosure may be constructed so that a one end E1 of the heat-dissipating structure 30 coincides with a one end of each of the display panel 10 and the rigid member 20. For example, the other ends E1 of the display panel 10, the rigid member 20, and the heat-dissipating structure 30 may be aligned with each other without a step.

In order that the other ends E1 of the display panel 10, the rigid member 20 and the heat-dissipating structure 30 are aligned with each other without the step, the display panel 10, the rigid member 20 and the heat-dissipating structure 30 have the same area or size.

In one example, when the display panel 10, the rigid member 20, and the heat-dissipating structure 30 are adhered to each other such that the other ends E1 of the display panel 10, the rigid member 20, and the heat-dissipating structure 30 are aligned with each other without the step, it is difficult to form the display apparatus 1 to be achieved so that a size thereof has exactly a target size. Accordingly, the display apparatus 1 is first formed to have a size larger than the target size, and then the display apparatus 1 is cut using a laser apparatus to form the display apparatus 1 having the target size to be achieved. For example, the display apparatus 1 may be first formed to have a size B larger than a target size A to be achieved.

Figure 3:
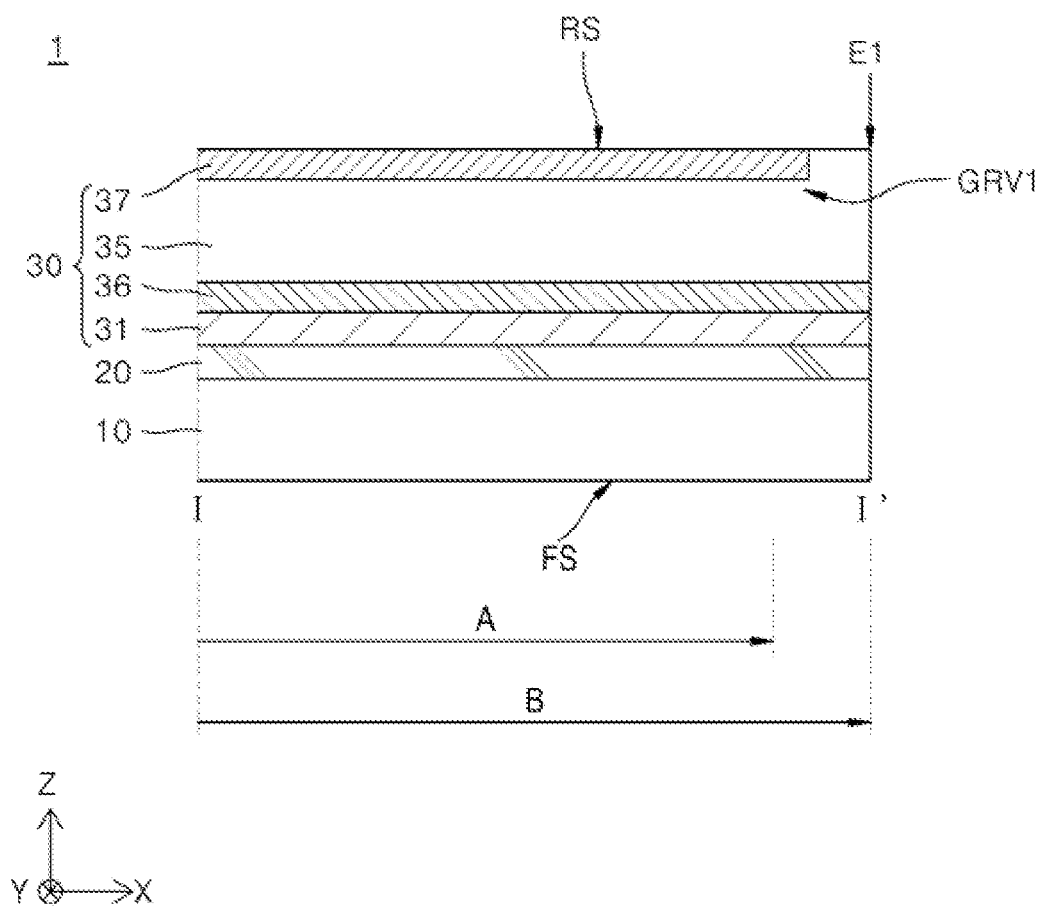
FIG. 3 is a cross-sectional view taken along cut line I-I' of FIG. 1 according to another aspect of the present disclosure.

FIG. 3 is a cross-sectional view taken along cutting line I-I' of FIG. 1 according to another aspect of the present disclosure.

With reference to FIG. 3, the display apparatus 1 according to another aspect of the present disclosure may include the display panel 10, a first rigid member 20, the first adhesive layer 31, and a first heat-dissipation layer 35. A recess (first recess or groove) GRV1 may be formed inwardly in an upper side (or an upper portion) of the first heat-dissipation layer 35. Hereinafter, the same or similar components as in FIG. 2 will be briefly described.

The display panel 10 may include the display substrate, and may include the display area AA that displays an image and the non-display area NAA.

The first rigid member (or first member) 20 may be disposed at an upper side (or an upper portion) of the display panel 10. The first rigid member 20 may be disposed on a bottom surface of the display substrate constituting the display panel 10 and may supplement the rigidity of the display substrate. The first rigid member 20 may be referred to as a back plate, or a support layer, etc. The present disclosure is not limited to the terminology.

The first adhesive layer 31 may be disposed at an upper side (or an upper portion) of the first rigid member 20. The first adhesive layer 31 constitutes the heat-dissipating structure 30, and may adhere the first rigid member 20 and the first heat-dissipation layer 35 to each other.

The first heat-dissipation layer 35 may be disposed at an upper side (or an upper portion) of the first adhesive layer 31. The first heat-dissipation layer 35 may dissipate the heat generated from the display panel 10 in a direction toward the rear surface RS of the display apparatus 1.

The first heat-dissipation layer 35 may be formed of a metal having multi-pores. For example, the first heat-dissipation layer 35 may be referred to as a metal foam, or a flexible conductive film (FCF), etc. The present disclosure is not limited to the terminology. A material of the first heat-dissipation layer 35 may include a metal. For example, the first heat-dissipation layer 35 may be formed of copper (Cu) which has high thermal conductivity and may have the multi-pores.

Since the first heat-dissipation layer 35 is formed of a metal having the multi-pores, the first heat-dissipation layer 35 may have a lighter weight than that of the same metal free of the pores. Since the metal has a soft property, workability such as cutting or bending thereof may be good. Further, since the first heat-dissipation layer 35 has the multi-pores, a surface area thereof in contact with air may be increased, and thus the first heat-dissipation layer 35 may have excellent heat dissipation ability.

In order to compensate for soft property of the first heat-dissipation layer 35, for example, to supplement the rigidity thereof, a second rigid member (second member) 36 may be disposed between the first adhesive layer 31 and the first heat-dissipation layer 35. The second rigid member 36 may additionally supplement the rigidity of the display panel 10 secured by the first rigid member 20. Further, the second rigid member 36 may absorb the heat generated from the display panel 10 and transfer the heat to the first heat-dissipation layer 35.

The second rigid member 36 may be embodied as a metal layer that may supplement the rigidity and transfer heat efficiently. For example, the second rigid member 36 may be formed of stainless steel (SUS). The present disclosure is not limited to the material. The second rigid member 36 may be referred to as a supporting metal layer, or a SUS layer, etc. The present disclosure is not limited to the terminology.

When the display panel 10 does not operate, a porous surface of the first heat-dissipation layer 35 may be viewed through the display panel 10. For example, the porous surface of the first heat-dissipation layer 35 may be visually recognized through the display panel 10, thereby causing poor aesthetics. Since the porous surface of the first heat-dissipation layer 35 is screened with the second rigid member 36 disposed between the display panel 10 and the first heat-dissipation layer 35, the poor aesthetics may be prevented.

A second heat-dissipation layer 37 may be additionally disposed at an upper side (or an upper portion) of the first heat-dissipation layer 35. For example, the second heat-dissipation layer 37 having a higher thermal conductivity than that of the first heat-dissipation layer 35 may be disposed thereon. Due to the presence of the second heat-dissipation layer 37, heat conduction or heat dissipation efficiency may be further improved.

The second heat-dissipation layer 37 may be formed of a material including graphite in order to obtain heat dissipation efficiency greater than that of the first heat-dissipation layer 35 formed of the metal having the pores. For example, the second heat-dissipation layer 37 may be embodied as a graphite layer. The present disclosure is not limited to the material.

A recess (or a first recess) GRV1 may be formed inwardly in the upper side of the first heat-dissipation layer 35. For example, the recess GRV1 may be formed to be stepped in a direction from the upper side of the first heat-dissipation layer 35 to a bottom surface thereof. The number of recesses GRV1 formed in the upper side of the first heat-dissipation layer 35 may be at least one. The present disclosure is not limited to the number.

The recess GRV1 may be filled with a second heat-dissipation layer 37. Accordingly, a vertical dimension of the display apparatus 1 may be increased by stacking a material with excellent thermal conductivity to obtain higher heat dissipation efficiency. In this regard, when the second heat-dissipation layer 37 is received in the first recess GRV1 of the first heat-dissipation layer 35, the heat-dissipation performance may be improved without increasing the overall thickness of display apparatus 1. For example, when the display apparatus 1 is bent, the heat-dissipation performance may be further improved without increasing the bezel area of the display apparatus 1.

Figure 4:
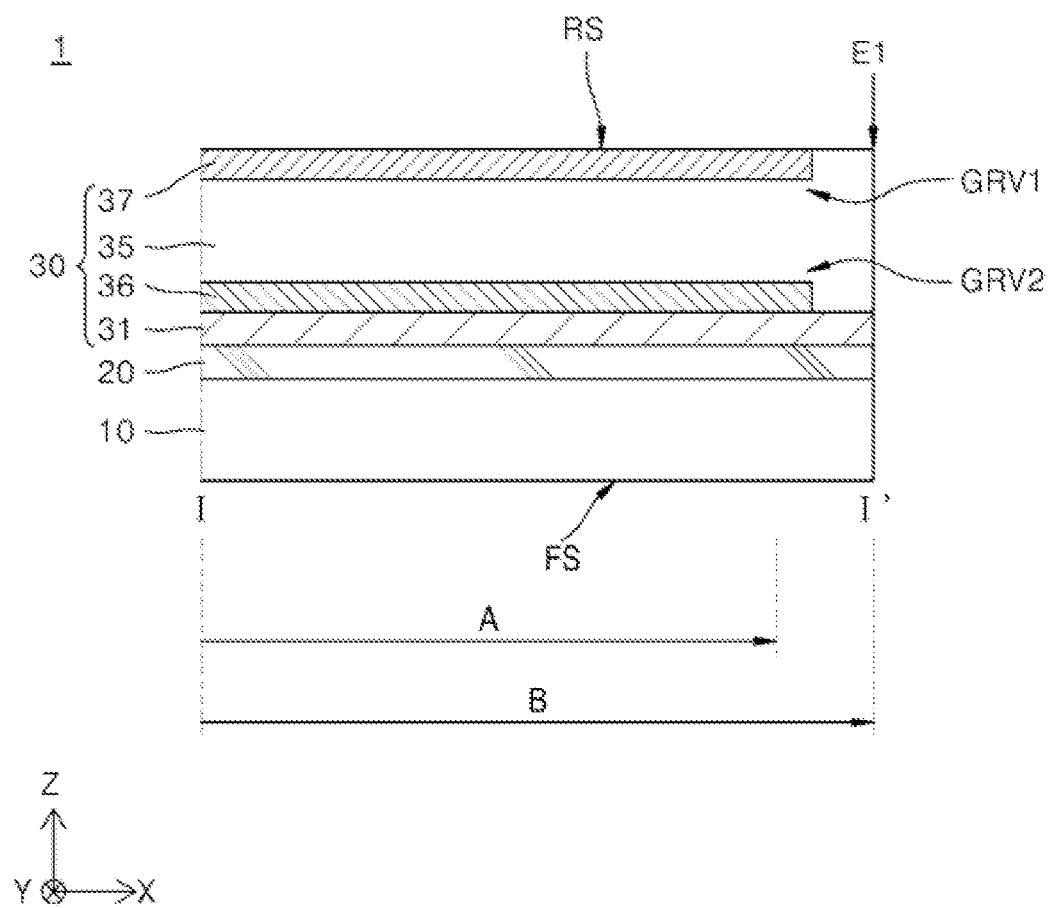
FIG. 4 is a cross-sectional view taken along cutting line I-I' of FIG. 1 according to still another aspect of the present disclosure.

FIG. 4 is a cross-sectional view along the cut line I-I' of FIG. 1 according to still another aspect of the present disclosure. With reference to FIG. 4, the display apparatus 1 according to still another aspect of the present disclosure may include the display panel 10, the first rigid member 20, the first adhesive layer 31, and the first heat-dissipation layer 35. Recesses (or grooves) GRV1 and GRV2 may be respectively formed inwardly in an upper side (one side), and a bottom surface (or the other side) of the first heat-dissipation layer 35. Hereinafter, the same or similar components as in FIG. 2 will be briefly described.

The display panel 10 may include the display substrate, and may include the display area AA that displays an image and the non-display area NAA.

The first rigid member (or first member) 20 may be disposed on an upper side of the display panel 10. The first rigid member 20 may be disposed on a bottom surface of the display substrate constituting the display panel 10 and may supplement the rigidity of the display substrate. The first rigid member 20 may be referred to as a back plate, or a support layer, etc. The present disclosure is not limited to the terminology.

The first adhesive layer 31 may be disposed on an upper side of the first rigid member 20. The first adhesive layer 31 constitutes the heat-dissipating structure 30, and may adhere the first rigid member 20 and the first heat-dissipation layer 35 to each other.

The first heat-dissipation layer 35 may be disposed on an upper side of the first adhesive layer 31. The first heat-dissipation layer 35 may dissipate the heat generated from the display panel 10 in a direction toward the rear surface RS of the display apparatus 1.

The first heat-dissipation layer 35 may be formed of a metal having multi-pores. For example, the first heat-dissipation layer 35 may be referred to as a metal foam, or a flexible conductive film (FCF), etc. The present disclosure is not limited to the terminology. A material of the first heat-dissipation layer 35 may include a metal. For example, the first heat-dissipation layer 35 may be formed of copper (Cu) which has high thermal conductivity and may have the multi-pores.

Since the first heat-dissipation layer 35 is formed of a metal having the multi-pores, the first heat-dissipation layer 35 may have a lighter weight than that of the same metal free of the pores. Since the metal has a soft property, workability such as cutting or bending thereof may be good. Further, since the first heat-dissipation layer 35 has the multi-pores, a surface area thereof in contact with air may be increased, and thus the first heat-dissipation layer 35 may have excellent heat dissipation ability.

In order to compensate for soft property of the first heat-dissipation layer 35, for example, to supplement the rigidity thereof, a second rigid member (second member) 36 may be disposed between the first adhesive layer 31 and the first heat-dissipation layer 35. The second rigid member 36 may additionally supplement the rigidity of the display panel 10 secured by the first rigid member 20. Further, the second rigid member 36 may absorb the heat generated from the display panel 10 and transfer the heat to the first heat-dissipation layer 35.

The second rigid member 36 may be embodied as a metal layer that may supplement the rigidity and transfer heat efficiently. For example, the second rigid member 36 may be formed of stainless steel (SUS). The present disclosure is not limited to the material. The second rigid member 36 may be referred to as a supporting metal layer, or a SUS layer, etc. The present disclosure is not limited to the terminology.

A recess (or a bottom recess or a second recess) GRV2 may be formed inwardly in the bottom surface of the first heat-dissipation layer 35. For example, the recess GRV2 may be formed to be stepped in a direction from the bottom surface of the first heat-dissipation layer 35 to the upper side thereof. The number of recesses GRV2 formed in the bottom surface of the first heat-dissipation layer 35 may be at least one. The present disclosure is not limited to the number.

The recess GRV2 may be filled with the second rigid member 36. Accordingly, a vertical dimension of the display apparatus 1 may be increased by stacking the second rigid member 36 in order to supplement the rigidity. In this regard, when the second rigid member 36 is received in the second recess GRV2 defined in the bottom surface of the first heat-dissipation layer 35, the heat-dissipation performance may be improved and the rigidity may be secured without increasing the overall thickness of display apparatus 1.

When the display panel 10 does not operate, a porous surface of the first heat-dissipation layer 35 may be viewed through the display panel 10. For example, the porous surface of the first heat-dissipation layer 35 may be visually recognized through the display panel 10, thereby causing poor aesthetics. Since the porous surface of the first heat-dissipation layer 35 is screened with the second rigid member 36 disposed between the display panel 10 and the first heat-dissipation layer 35, the poor aesthetics may be prevented.

The second heat-dissipation layer 37 may be additionally disposed in an upper side of the first heat-dissipation layer 35. For example, the second heat-dissipation layer 37 having a higher thermal conductivity than that of the first heat-dissipation layer 35 may be disposed thereon. Due to the presence of the second heat-dissipation layer 37, heat conduction or heat dissipation efficiency may be further improved.

The second heat-dissipation layer 37 may be formed of a material including graphite in order to obtain heat dissipation efficiency greater than that of the first heat-dissipation layer 35 formed of the metal having the pores. For example, the second heat-dissipation layer 37 may be embodied as a graphite layer. The present disclosure is not limited to the material.

A recess (or a first recess or a top recess) GRV1 may be formed inwardly in the upper side of the first heat-dissipation layer 35. For example, the recess GRV1 may be formed to be stepped in a direction from the upper side of the first heat-dissipation layer 35 to a bottom surface thereof. The number of recesses GRV1 formed in the upper side of the first heat-dissipation layer 35 may be at least one. The present disclosure is not limited to the number.

The recess GRV1 may be filled with the second heat-dissipation layer 37. Accordingly, a vertical dimension of the display apparatus 1 may be increased by stacking a material with excellent thermal conductivity to obtain higher heat dissipation efficiency. In this regard, when the second heat-dissipation layer 37 is received in the first recess GRV1 of the first heat-dissipation layer 35, the heat-dissipation performance may be improved without increasing the overall thickness of display apparatus 1. For example, when the display apparatus 1 is bent, the heat-dissipation performance may be further improved without increasing the bezel area of the display apparatus 1.

Figure 5:
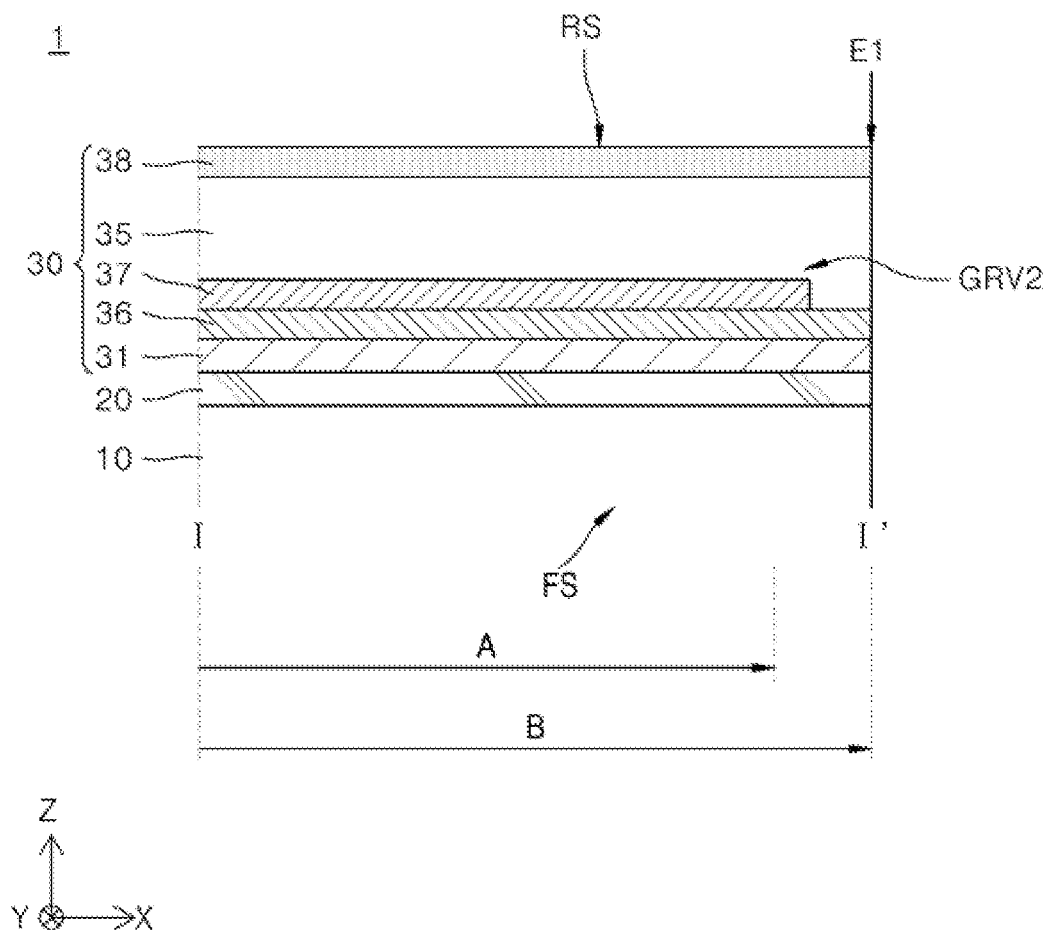
FIG. 5 is a cross-sectional view taken along cutting line I-I' of FIG. 1 according to still yet another aspect of the present disclosure.

FIG. 5 is a cross-sectional view along the cut line I-I' of FIG. 1 according to still yet another aspect of the present disclosure. With reference to FIG. 5, the display apparatus 1 according to still yet another aspect of the present disclosure may include the display panel 10, the first rigid member 20, the first adhesive layer 31, and the first heat-dissipation layer 35. A recess GRV2 may be formed inwardly in the bottom surface of the first heat-dissipation layer 35. Hereinafter, the same or similar components as in FIG. 2 will be briefly described.

The display panel 10 may include the display substrate, and may include the display area AA that displays an image and the non-display area NAA.

The first rigid member (or first member) 20 may be disposed on an upper side of the display panel 10. The first rigid member 20 may be disposed on a bottom surface of the display substrate constituting the display panel 10 and may supplement the rigidity of the display substrate. The first rigid member 20 may be referred to as a back plate, or a support layer, etc. The present disclosure is not limited to the terminology.

The first adhesive layer 31 may be disposed on an upper side of the first rigid member 20. The first adhesive layer 31 constitutes the heat-dissipating structure 30, and may adhere the first rigid member 20 and the first heat-dissipation layer 35 to each other.

The first heat-dissipation layer 35 may be disposed on an upper side of the first adhesive layer 31. The first heat-dissipation layer 35 may dissipate the heat generated from the display panel 10 in a direction toward the rear surface RS of the display apparatus 1.

The first heat-dissipation layer 35 may be formed of a metal having multi-pores. For example, the first heat-dissipation layer 35 may be referred to as a metal foam, or a flexible conductive film (FCF), etc. The present disclosure is not limited to the terminology. A material of the first heat-dissipation layer 35 may include a metal. For example, the first heat-dissipation layer 35 may be formed of copper (Cu) which has high thermal conductivity and may have the multi-pores.

Since the first heat-dissipation layer 35 is formed of a metal having the multi-pores, the first heat-dissipation layer 35 may have a lighter weight than that of the same metal free of the pores. Since the metal has a soft property, workability such as cutting or bending thereof may be good. Further, since the first heat-dissipation layer 35 has the multi-pores, a surface area thereof in contact with air may be increased, and thus the first heat-dissipation layer 35 may have excellent heat dissipation ability.

In order to compensate for soft property of the first heat-dissipation layer 35, for example, to supplement the rigidity thereof, a second rigid member (second member) 36 may be disposed between the first adhesive layer 31 and the first heat-dissipation layer 35. The second rigid member 36 may additionally supplement the rigidity of the display panel 10 secured by the first rigid member 20. Further, the second rigid member 36 may absorb the heat generated from the display panel 10 and transfer the heat to the first heat-dissipation layer 35.

The second rigid member 36 may be embodied as a metal layer that may supplement the rigidity and transfer heat efficiently. For example, the second rigid member 36 may be formed of stainless steel (SUS). The present disclosure is not limited to the material. The second rigid member 36 may be referred to as a supporting metal layer, or a SUS layer, etc. The present disclosure is not limited to the terminology.

When the display panel 10 does not operate, a porous surface of the first heat-dissipation layer 35 may be viewed through the display panel 10. For example, the porous surface of the first heat-dissipation layer 35 may be visually recognized through the display panel 10, thereby causing poor aesthetics. Since the porous surface of the first heat-dissipation layer 35 is screened with the second rigid member 36 disposed between the display panel 10 and the first heat-dissipation layer 35, the poor aesthetics may be prevented.

The second heat-dissipation layer 37 may be additionally disposed in the bottom surface of the first heat-dissipation layer 35. For example, the second heat-dissipation layer 37 having a higher thermal conductivity than that of the first heat-dissipation layer 35 may be disposed thereon. Due to the presence of the second heat-dissipation layer 37, heat conduction or heat dissipation efficiency may be further improved.

The second heat-dissipation layer 37 may be formed of a material including graphite in order to obtain heat dissipation efficiency greater than that of the first heat-dissipation layer 35 formed of the metal having the pores. For example, the second heat-dissipation layer 37 may be embodied as a graphite layer. The present disclosure is not limited to the material.

A recess (or a bottom recess) GRV2 may be formed inwardly in the bottom surface of the first heat-dissipation layer 35. For example, the recess GRV2 may be formed to be stepped in a direction from the bottom surface of the first heat-dissipation layer 35 to the upper side thereof. The number of recesses GRV2 formed in the bottom surface of the first heat-dissipation layer 35 may be at least one. The present disclosure is not limited to the number. For example, the recess GRV2 may be formed in a surface different from a surface in which the recess GRV1 is formed.

The recess GRV2 may be filled with the second heat-dissipation layer 37. Accordingly, a vertical dimension of the display apparatus 1 may be increased by stacking a material with excellent thermal conductivity to obtain higher heat dissipation efficiency. In this regard, when the second heat-dissipation layer 37 is received in the bottom recess GRV2 defined in the bottom surface of the first heat-dissipation layer 35, the heat-dissipation performance may be improved without increasing the overall thickness of display apparatus 1. For example, when the display apparatus 1 is bent, the heat-dissipation performance may be further improved without increasing the bezel area of the display apparatus 1.

A third heat-dissipation layer 38 may be additionally disposed at the upper side (or an upper portion) of the first heat-dissipation layer 35. The third heat-dissipation layer 38 may be formed by applying an ink material. The third heat-dissipation layer 38 may improve heat dissipation efficiency.

The ink material constituting the third heat-dissipation layer 38 may be obtained by dissolving an organic dispersant and an inorganic binder in distilled water, alcohol, or an organic solvent, and adding an additive for heat-dissipation thereto. The additive for heat-dissipation may include carbon nanotubes, graphite, graphene, metal-carbon nanocomposites, or ceramic. However, the present disclosure is not limited to the material.

Thermal conductivity of each of the second heat-dissipation layer 37 and the third heat-dissipation layer 38 may be higher than the thermal conductivity of the first heat-dissipation layer 35. The thermal conductivity of the first heat-dissipation layer 35 may be higher than that of the second rigid member. This may allow a display apparatus capable of securing more efficient heat-dissipation function to be realized.

A display apparatus according to an aspect of the present disclosure may be described as follows.

The display apparatus according to an aspect of the present disclosure comprises, a display panel configured to display an image from one surface of the display panel; a first rigid member disposed at another surface of the display panel; a first adhesive layer disposed at an upper portion of the first rigid member; and a first heat-dissipation layer disposed at an upper portion of the first adhesive layer, wherein the first heat-dissipation layer has a first recess or a second recess having a step formed inwardly in one side or another side.

According to some aspect of the present disclosure, the second recess and the first recess may be formed in different side of the first heat-dissipation layer.

According to some aspect of the present disclosure, the display apparatus may further comprise a second rigid member disposed between the first adhesive layer and the first heat-dissipation layer.

According to some aspect of the present disclosure, the second rigid member may be received in the second recess of the first heat-dissipation layer.

According to some aspect of the present disclosure, the display apparatus may further comprise a second heat-dissipation layer received in the first recess of the first heat-dissipation layer.

According to some aspect of the present disclosure, the display apparatus may further comprise a second heat-dissipation layer received in the second recess of the first heat-dissipation layer.

According to some aspect of the present disclosure, the display apparatus may further comprise a second heat-dissipation layer received in the second recess of the first heat-dissipation layer.

According to some aspect of the present disclosure, the second heat-dissipation layer may be formed of a material including graphite.

According to some aspect of the present disclosure, the first heat-dissipation layer may be formed of a porous metal.

According to some aspect of the present disclosure, the display apparatus may further comprise a third heat-dissipation layer at an upper portion of the first heat-dissipation layer.

According to another aspect of the present disclosure, a display apparatus comprises, a display panel configured to display an image from one surface of the display panel; a first member disposed at another surface of the display panel; a first adhesive layer disposed at an upper portion of the first member; a first heat-dissipation layer disposed at an upper portion of the first adhesive layer and formed of a porous metal; and a third heat-dissipation layer disposed at an upper portion of the first heat-dissipation layer and including an ink material, wherein the first heat-dissipation layer has a recess having a step formed inwardly in a lower surface.

According to some aspect of the present disclosure, the display apparatus may further comprise a second heat-dissipation layer received at the recess.

According to some aspect of the present disclosure, the display apparatus may further comprise a second member disposed between the first adhesive layer and the first heat-dissipation layer.

According to some aspect of the present disclosure, the display apparatus may further comprise a second member received at the recess.

It will be apparent to those skilled in the art that various modifications and variations can be formed in the present disclosure without departing from the technical idea or scope of the disclosures. Thus, it is intended that the present disclosure covers the modifications and variations of this disclosure provided they come within the scope of the appended claims and their equivalents.

What is claimed is:

1. A display apparatus, comprising:
    a display panel configured to display an image from one surface of the display panel;
    a first rigid member disposed at another surface of the display panel;
    a first adhesive layer disposed at an upper portion of the first rigid member;
    a first heat-dissipation layer disposed at an upper portion of the first adhesive layer; and
    a second rigid member disposed between the first adhesive layer and the first heat-dissipation layer,
    wherein the first heat-dissipation layer has a first recess and a second recess having a step formed inwardly in one side and another side,
    wherein the second recess is formed on an opposite side of the first recess of the first heat-dissipation layer.

2. The display apparatus of claim 1, wherein the second rigid member is disposed in the second recess of the first heat-dissipation layer.

3. The display apparatus of claim 1, further comprising a second heat-dissipation layer disposed in the first recess of the first heat-dissipation layer.

4. The display apparatus of claim 3, wherein the second heat-dissipation layer is formed of a material including graphite.

5. The display apparatus of claim 1, further comprising a second heat-dissipation layer disposed in the second recess of the first heat-dissipation layer.

6. The display apparatus of claim 1, wherein the first heat-dissipation layer is formed of a porous metal.

7. The display apparatus of claim 1, further comprising a third heat-dissipation layer at an upper portion of the first heat-dissipation layer.

8. A display apparatus, comprising:
    a display panel configured to display an image from one side of the display panel;
    a first member disposed in contact with another side of the display panel;
    a first adhesive layer disposed at an upper portion of the first member;
    a first heat-dissipation layer disposed at an upper portion of the first adhesive layer and including a porous metal;
    a second rigid member disposed between the first adhesive layer and the first heat-dissipation layer; and
    a third heat-dissipation layer disposed at an upper portion of the first heat-dissipation layer and including an ink material,
    wherein the first heat-dissipation layer has a recess having a step formed inwardly in a lower surface.

9. The display apparatus of claim 8, further comprising a second heat-dissipation layer disposed at the recess.

10. The display apparatus of claim 8, wherein the second rigid member is disposed at the recess.

* * * * *